US011216747B2

United States Patent
Kim et al.

(10) Patent No.: US 11,216,747 B2
(45) Date of Patent: Jan. 4, 2022

(54) ARTIFICIAL INTELLIGENT SYSTEM INCLUDING PRE-PROCESSING UNIT FOR SELECTING VALID DATA

(71) Applicant: Electronics and Telecommunications Research Institute, Daejeon (KR)

(72) Inventors: Sung Eun Kim, Daejeon (KR); Seong Mo Park, Daejeon (KR); Kwang IL Oh, Daejeon (KR); Tae Wook Kang, Daejeon (KR); Mi Jeong Park, Sejong-si (KR); Hyung-IL Park, Daejeon (KR); Jae-Jin Lee, Daejeon (KR); In Gi Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 405 days.

(21) Appl. No.: 16/379,464

(22) Filed: Apr. 9, 2019

(65) Prior Publication Data

US 2019/0311291 A1 Oct. 10, 2019

(30) Foreign Application Priority Data

Apr. 10, 2018 (KR) .................. 10-2018-0041771

(51) Int. Cl.
*G06N 20/00* (2019.01)
*G06N 5/02* (2006.01)
*G01R 19/00* (2006.01)
*G01R 19/10* (2006.01)

(52) U.S. Cl.
CPC .............. *G06N 20/00* (2019.01); *G01R 19/00* (2013.01); *G01R 19/10* (2013.01); *G06N 5/02* (2013.01)

(58) Field of Classification Search
CPC ........ G01R 19/00; G06N 20/00; G06N 3/049; G06N 3/0635; G06N 5/02; G06N 3/08
USPC ......................................................... 702/64
See application file for complete search history.

(56) References Cited

U.S. PATENT DOCUMENTS

| 5,867,593 | A | 2/1999 | Fukuda et al. |
| 9,875,737 | B2 | 1/2018 | Jung |
| 9,875,747 | B1 | 1/2018 | Kim et al. |
| 2014/0177946 | A1 | 6/2014 | Lim et al. |
| 2017/0286774 | A1 | 10/2017 | Gaidon |
| 2019/0066845 | A1* | 2/2019 | Roy .................... G06N 3/08 |

FOREIGN PATENT DOCUMENTS

| JP | H07-121656 A | 5/1995 |
| KR | 10-1512370 B1 | 4/2015 |

* cited by examiner

*Primary Examiner* — John H Le
(74) *Attorney, Agent, or Firm* — Rabin & Berdo, P.C.

(57) ABSTRACT

Provided is an artificial intelligence system. The system includes a first sensor configured to generate a first sensing signal during a sensing time, a second sensor disposed adjacent to the first sensor and configured to generate a second sensing signal during the sensing time, a pre-processing unit configured to select valid data according to a magnitude of a differential signal generated based on a difference between the first sensing signal and the second sensing signal, and an artificial intelligence module configured to analyze the valid data to generate result data.

14 Claims, 8 Drawing Sheets ly under 35 U.S.C. § 119 of Korean Patent Application
ARTIFICIAL INTELLIGENT SYSTEM INCLUDING PRE-PROCESSING UNIT FOR SELECTING VALID DATA

CROSS-REFERENCE TO RELATED APPLICATIONS

This U.S. non-provisional patent application claims priority under 35 U.S.C. § 119 of Korean Patent Application No. 10-2018-0041771, filed on Apr. 10, 2018, the entire contents of which are hereby incorporated by reference.

BACKGROUND

The present disclosure herein relates to an artificial intelligence system, and more particularly, to an artificial intelligence system including a pre-processing unit for selecting valid data.

There is a growing interest in artificial intelligence systems that process information by applying human thought, reasoning, and learning processes to electronic devices such as computers. Artificial intelligence systems may process information by mimicking neurons and synapses contained in the human brain. Since an artificial intelligence system actively processes the input information based on the constructed learning model, it has an advantage of having an effective problem solving ability for continuously changing surrounding information. Such an artificial intelligence system may be applied to various fields such as danger recognition, security and surveillance, autonomous navigation, smart management, and Internet of things.

Conventional artificial intelligence research has focused on processing a large and big data at high speed. In order to apply artificial intelligence systems to the various fields described above, an artificial intelligence module may collect sensing data from a plurality of sensors. However, due to the need for precise sensor and the development of information and communication technology, the amount of sensing data is increasing exponentially. Artificial intelligence modules require significant power and computation to process these large amounts of sensing data. Therefore, there is a demand for a method to minimize the amount of data inputted to the artificial intelligence module, but to ensure the accuracy of the data analysis.

SUMMARY

The present disclosure is to provide an artificial intelligence system including a pre-processing unit for selecting valid data that may ensure the accuracy of data analysis while reducing the amount of computation of the artificial intelligence module.

An embodiment of the inventive concept provides an artificial intelligence system including: a first sensor configured to generate a first sensing signal during a sensing time; a second sensor disposed adjacent to the first sensor and configured to generate a second sensing signal during the sensing time; a pre-processing unit configured to select valid data according to a magnitude of a differential signal generated based on a difference between the first sensing signal and the second sensing signal; and an artificial intelligence module configured to analyze the valid data to generate result data.

In an embodiment, the pre-processing unit may includes: a differential amplification circuit configured to generate the differential signal based on a difference between the first sensing signal and the second sensing signal; and a comparison circuit configured to select the valid data based on a comparison result of the differential signal and a reference signal. The comparison circuit may select the differential signal as the valid data and output the differential signal to the artificial intelligence module when a magnitude of the differential signal is larger than a magnitude of the reference signal. When a magnitude of the differential signal is less than or equal to a magnitude of the reference signal, the comparison circuit may select the differential signal as invalid data and remove the differential signal. The pre-processing unit may include: a differential amplification circuit configured to generate the differential signal based on a difference between the first sensing signal and the second sensing signal; a comparison circuit configured to generate an enable signal based on a comparison result between the differential signal and the reference signal; and a data transfer circuit configured to output the differential signal as the valid data when the enable signal is received.

In an embodiment, the artificial intelligence system may further include a third sensor disposed adjacent to the first sensor and configured to generate a third sensing signal during the sensing time, and a fourth sensor disposed adjacent to the second and third sensors and configured to generate a fourth sensing signal during the sensing time. The first sensor and the second sensor may be disposed adjacent to each other in a first direction, the first sensor and the third sensor may be disposed adjacent to each other in a second direction intersecting the first direction, the second sensor and the fourth sensor may be disposed adjacent to each other in the second direction, and the third sensor and the fourth sensor may be disposed adjacent to each other in the first direction. The pre-processing unit may further select the valid data based on a difference between the first and third sensing signals, a difference between the second and fourth sensing signals, and a difference between the third and fourth sensing signals.

In an embodiment, the artificial intelligence system may further include an artificial intelligence hub device for determining a state of a periphery of the first sensor and the second sensor based on the result data. The artificial intelligence hub device may learn the result data or the valid data and resets the reference signal. The artificial intelligence module may determine a state of a periphery of the first sensor and the second sensor when receiving the valid data.

In an embodiment of the inventive concept artificial intelligence system includes: a sensor configured to generate a first sensing signal during a first sensing time and a second sensing signal during a second sensing time after the first sensing time; a pre-processing unit configured to select valid data according to a magnitude of a differential signal generated based on a difference between the first sensing signal and the second sensing signal; and an artificial intelligence module configured to analyze the valid data and generate result data.

In an embodiment, the pre-processing unit may include: a differential amplification circuit configured to generate the differential signal based on a difference between the first sensing signal and the second sensing signal; and a comparison circuit configured to select the differential signal as the valid data and output the selected signal to the artificial intelligence module when the differential signal is larger than a reference signal. The pre-processing unit may include: a differential amplification circuit configured to generate the differential signal based on a difference between the first sensing signal and the second sensing signal; a comparison circuit configured to generate an enable signal when the differential signal is greater than a reference signal; and a data transfer circuit configured to output the differential signal as the valid data to the artificial intelligence module based on the enable signal.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the following, embodiments of the inventive concept will be described in detail so that those skilled in the art easily carry out the inventive concept.

Figure 1:
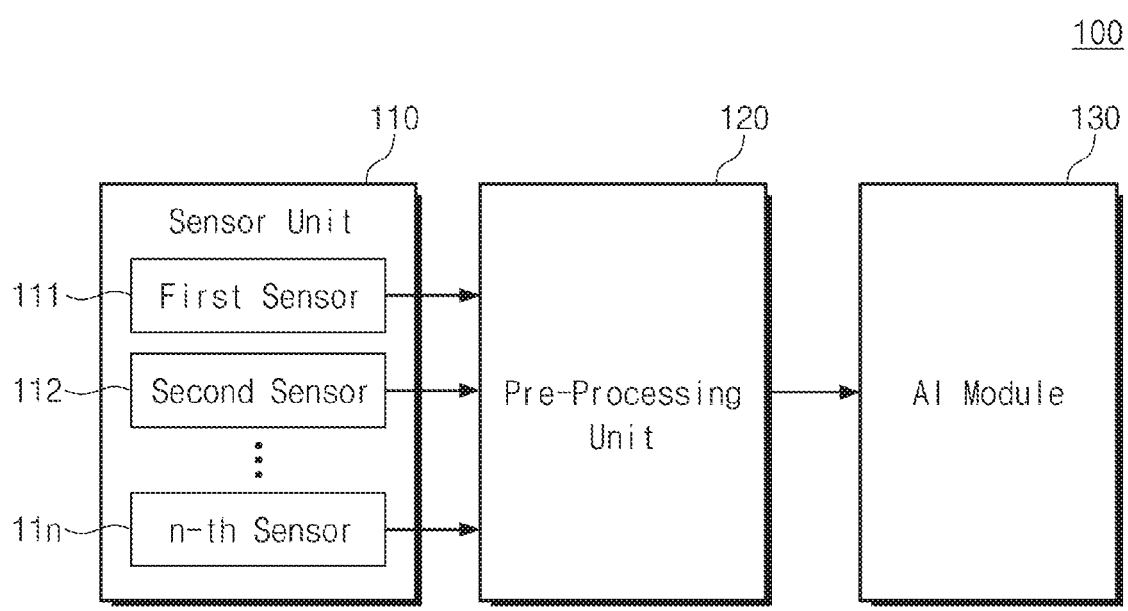
FIG. 1 is a block diagram of an artificial intelligence system according to an embodiment of the inventive concept.

FIG. 1 is a block diagram of an artificial intelligence system according to an embodiment of the inventive concept. Referring to FIG. 1, an artificial intelligence system 100 includes a sensor unit 110, a pre-processing unit 120, and an artificial intelligence module 130. The artificial intelligence system 100 of FIG. 1 may be applied to various fields, and the subject of application is not limited. For example, the artificial intelligence system 100 may be applied to various fields such as a warning system for recognizing an emergency situation, a security or surveillance system, a vehicle system such as an autonomous vehicle, and an Internet of Things system for managing an indoor environment.

The sensor unit 110 may include first to n-th sensors 111 to 11n. For example, the sensor unit 110 may include a plurality of sensors, and is illustratively shown including n sensors. Each of the first to n-th sensors 111 to 11n may be a sensor of the same kind, but is not limited thereto and may be a different kind of sensor. Each of the first to n-th sensors 111 to 11n may sense various elements of the surrounding environment. For example, each of the first to n-th sensors 111 to 11n may include an image sensor, an optical sensor, a temperature sensor, a gyro sensor, an acoustic sensor, a pressure sensor, a vibration sensor, and an oxygen concentration detection sensor.

Each of the first to n-th sensors 111 to 11n provides a pre-processing unit 120 with a sensing signal for the arranged area. Each of the first to n-th sensors 111 to 11n may be disposed at different positions. During the sensing time, the first sensor 111 may provide a sensing signal for the first area to the pre-processing unit 120, and the second sensor 112 may provide a sensing signal for the second area to the pre-processing unit 120. The separation distance between the first to n-th sensors 111 to 11n may be determined according to the application field of the artificial intelligence system 100. For example, when the first to n-th sensors 111 to 11n are provided for managing warpage and the like of a building, the separation distance may be large, as compared with the case where it is provided to the vehicle for autonomous driving or is provided for detecting the user's medical biometric data. The first to n-th sensors 111 to 11n may be separated from each other. Each of the first to n-th sensors 111 to 11n may output a sensing signal detected at the corresponding position to the pre-processing unit 120.

Each of the first to n-th sensors 111 to 11n continuously provides a sensing signal to the pre-processing unit 120 over time. Each of the first to n-th sensors 111 to 11n provides a sensing signal to the pre-processing unit 120 for a first sensing time, and provides a sensing signal to the pre-processing unit 120 during a second sensing time after the first sensing time. That is, the sensor unit 110 may output sensing signals for different times as well as sensing signals for different spaces to the pre-processing unit 120.

The pre-processing unit 120 receives a plurality of sensing signals (first to n-th sensing signals) from the first to n-th sensors 111 to 11n and preprocesses the received sensing signals. The pre-processing unit 120 may generate differential signals for the received first to n-th sensing signals. The differential signals are generated based on the difference of the two sensing signals received from the two spatially adjacent sensors among the first to n-th sensors 111 to 11n. There may not be another sensor between two adjacent sensors. A detailed description of the meaning of the two adjacent sensors will be described later with reference to FIG. 2.

As described above, the pre-processing unit 120 may generate differential signals for spatially adjacent sensing signals as well as generate differential signals for temporally adjacent sensing signals. The pre-processing unit 120 may generate a differential signal for a sensing signal for a first sensing time and a sensing signal generated after the first sensing time. That is, the artificial intelligence system 100 may determine the state of the periphery of the sensor unit 110 using the amount of change between spatially adjacent sensing signals, the amount of change between temporally adjacent sensing signals, or both the two amounts of changes.

The pre-processing unit 120 selects valid data among the differential signals and provides the valid data to the artificial intelligence module 130. The pre-processing unit 120 may compare the differential signals with predetermined reference signal. The pre-processing unit 120 may determine differential signals having greater (or more) intensity than the reference signal among the differential signals as valid data. For example, information corresponding to a case where there is an abrupt difference between an environment of a specific area and an environment of an area adjacent to the specific area may be determined as valid data. Here, the intensity of the differential signals may mean the intensity of the voltage or current of the differential signals.

The pre-processing unit 120 may determine differential signals having less (or less) intensity than the reference signal among the differential signals as invalid data. That is, information corresponding to a case where there is a small difference between the environment of the specific area and the environment of the area adjacent to the specific area or there is no difference may be determined as the invalid data.

Differential signals determined as invalid data may be removed from the pre-processing unit 120. Since the invalid data is not provided to the artificial intelligence module 130, the amount of data inputted to the artificial intelligence module 130 may be reduced. Accordingly, the amount of computation of the artificial intelligence module 130 may be reduced, and the power consumption of the artificial intelligence module 130 may be reduced. Furthermore, since the pre-processing unit 120 selects key information corresponding to a suddenly changing situation as valid data and outputs the key information to the artificial intelligence module 130, the reduction in the accuracy of data analysis due to the reduction in the amount of computation of the artificial intelligence module 130 may be minimized.

The artificial intelligence module 130 may analyze the received valid data and calculate the result data according to the analyzed result. For this, the artificial intelligence module 130 may learn the continuously received valid data in advance, and accordingly, a learning model may be constructed. Based on the constructed learning model, the artificial intelligence module 130 may analyze and determine the situation of the periphery of the sensor unit 110 and generate the result data. Further, the artificial intelligence module 130 may control the operation of the artificial intelligence system 100 based on the result data.

For example, if the sensor unit 110 includes temperature sensors located indoors, the valid data may be information indicating that the temperature difference between two spatially adjacent regions is above a reference temperature. The artificial intelligence module 130 analyzes the valid data to analyze the cause of the temperature difference between two adjacent areas. Illustratively, as a result of analyzing the valid data, the temperature change due to the intrusion of the outsider may be calculated as result data, and based on the result data, an output device (not shown), for example, a warning lamp, a siren, a display device, etc., may be controlled.

The artificial intelligence module 130 may be implemented as a hardware device for analyzing and determining valid data. For example, the artificial intelligence module 130 may be implemented in a neuromorphic computation chip or the like for constructing a learning model by performing learning through an artificial neural network, or may be implemented in a dedicated logic circuit such as a Field Programmable Gate Array (FPGA) or an Application Specific Integrated Circuit (ASIC). Alternatively, the artificial intelligence module 130 may be implemented as software or firmware. In this case, the artificial intelligence module 130 may include a processor for performing control and computation operations required to analyze valid data, a storage for storing software or firmware for analyzing valid data, and a memory for loading the software or firmware.

Figure 2:
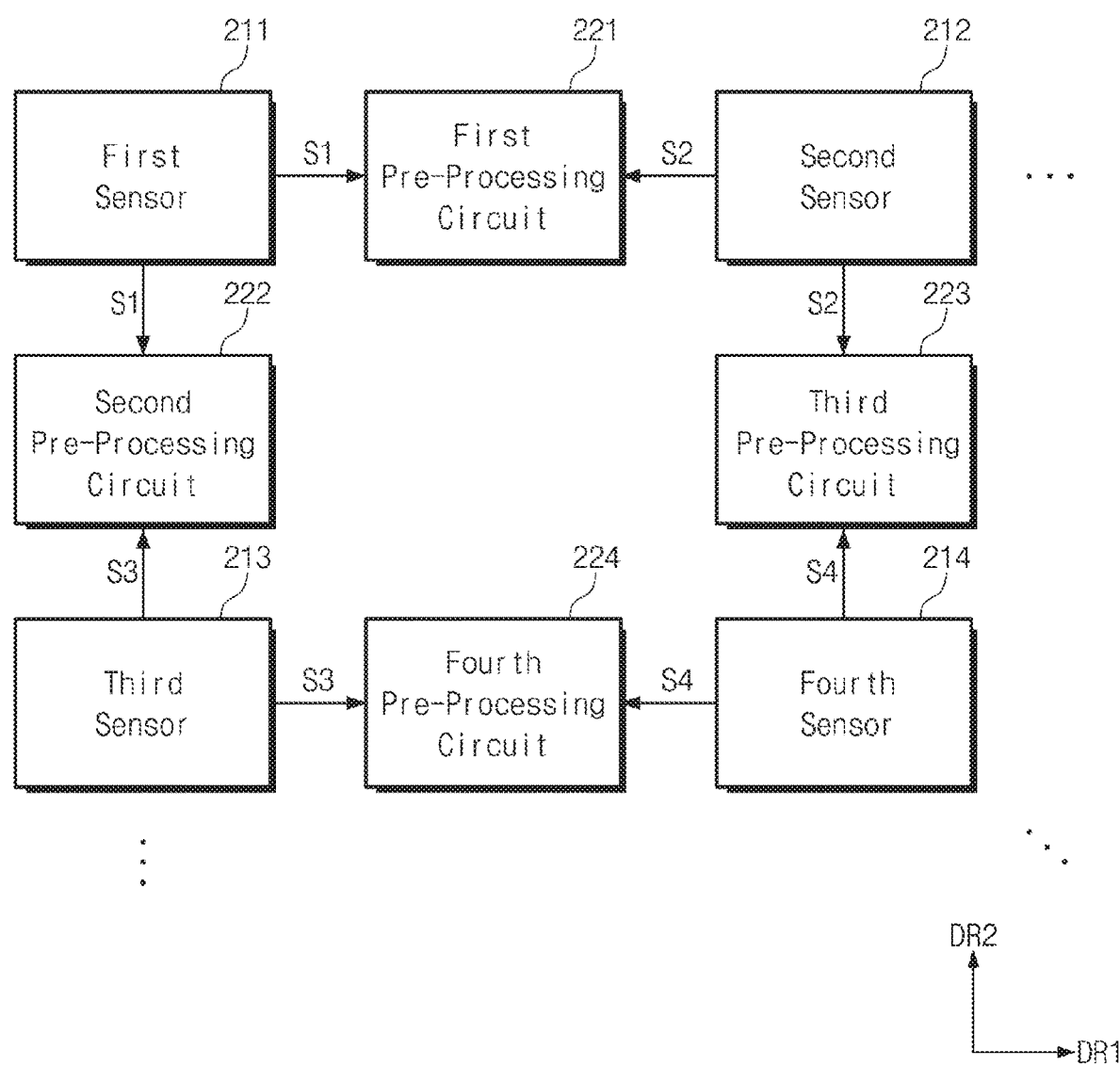
FIG. 2 is a block diagram specifically illustrating an embodiment of the artificial intelligence system of FIG. 1.

FIG. 2 is a block diagram specifically illustrating an embodiment of the artificial intelligence system of FIG. 1. FIG. 2 is a diagram for explaining a process of preprocessing sensing signals outputted from spatially adjacent sensors. Referring to FIG. 2, the artificial intelligence system 200 includes first to fourth sensors 211 to 214 and first to fourth pre-processing circuits 221 to 224. It will be understood that the first to fourth sensors 211 to 214 are included in the sensor unit 110 of FIG. 1 and the first to fourth pre-processing circuits 221 to 224 are included in the pre-processing unit 120 of FIG. 1. The artificial intelligence module is omitted from FIG. 2 for convenience of description. It is assumed that the first direction DR1 and the second direction DR2 intersect each other, and the first to fourth sensors 211 to 214 are disposed on a plane formed by the first direction DR1 and the second direction DR2 for convenience of description.

Each of the first to fourth sensors 211 to 214 generates the first to fourth sensing signals S1 to S4 during the sensing time. The time at which the first to fourth sensing signals S1 to S4 are generated may be identical to each other. FIG. 2 shows four sensors, but the inventive concept is not limited thereto. Thus, more sensors may be included in the artificial intelligence system 200. The first sensor 211 and the second sensor 212 may be adjacent to each other in the first direction DR1 and no other sensor may be disposed between the first sensor 211 and the second sensor 212. The first sensor 211 and the third sensor 213 may be adjacent to each other in the second direction DR2 and no other sensor may be disposed between the first sensor 211 and the third sensor 213. The second sensor 212 and the fourth sensor 214 may be adjacent to each other in the second direction DR2 and no other sensor may be disposed between the second sensor 212 and the fourth sensor 214. The third sensor 213 and the fourth sensor 214 may be adjacent to each other in the first direction DR1 and no other sensor may be disposed between the third sensor 213 and the fourth sensor 214.

For convenience of explanation, the first to fourth sensors 211 to 214 are shown as being arranged in a matrix form on a two-dimensional plane, but the inventive concept is not limited thereto. For example, the first to fourth sensors 211 to 214 may have different separation distances. Also, the first to fourth sensors 211 to 214 may be disposed adjacent to each other in another direction where the first direction DR1 and the second direction DR2 intersect. When the sensors are arranged in a matrix form on a two-dimensional plane, the number of sensors adjacent to one sensor may be four. When the sensors are arranged in a matrix form on a three-dimensional plane, the number of sensors adjacent to one sensor may be six. However, when the artificial intelligence system 200 is actually implemented, the number of sensors adjacent to one sensor may be designed to be limited to less than the reference number.

Each of the first to fourth pre-processing circuits 221 to 224 receives a sensing signal from two spatially adjacent sensors for preprocessing. The first pre-processing circuit 221 receives the first sensing signal S1 from the first sensor 211 and the second sensing signal S2 from the second sensor 212. The second pre-processing circuit 222 receives the first sensing signal S1 from the first sensor 211 and the third sensing signal S3 from the third sensor 213. The third pre-processing circuit 223 receives the second sensing signal S2 from the second sensor 212 and receives the fourth sensing signal S4 from the fourth sensor 214. The fourth pre-processing circuit 224 receives the third sensing signal S3 from the third sensor 213 and the fourth sensing signal S4 from the fourth sensor 214.

Each of the first to fourth pre-processing circuits 221 to 224 generates a differential signal based on the difference between the two received sensing signals. As the number of sensors increases, the number of differential signals may be greater than the number of sensing signals. For example, the number of differential signals based on 2×2 sensors would be equal to the number of four sensing signals, but the number of differential signals based on 4×4 sensors is 24, which is more than 16, that is, the number of sensing signals. However, the amount of data inputted to the artificial intelligence module in the process of selecting valid data to be described later may be reduced. By adopting the differential signal, which is a relative size, as input data to the artificial intelligence module, the environmental variation in the adjacent area may be analyzed easily. Further, when the surrounding environment changes sensitively with time, by using the differential signal to exclude a change in the overall environment, the area where the abnormal state occurs may be easily extracted.

Each of the first to fourth pre-processing circuits 221 to 224 may compare the generated differential signal with a reference signal. The reference signal may be a voltage or current that is the reference for selecting valid data and invalid data. Illustratively, the reference signal may be defined as a minimum size that is expected to deviate from a normal state depending on the application field of the artificial intelligence system 200. If the differential signal is larger than (or greater than) the reference signal, the differential signal may be adopted as valid data. If the differential signal is equal to or less than (or smaller than) the reference signal, the differential signal may be adopted as invalid data. The first to fourth pre-processing circuits 221 to 224 may output the differential signal adopted as the valid data to the artificial intelligence module and remove the differential signal adopted as the invalid data.

The first to fourth pre-processing circuits 221 to 224 may be implemented as analog circuits, and the first to fourth sensing signals S1 to S4 may be analog signals. As the first to fourth pre-processing circuits 221 to 224 process analog signals, a separate configuration for digitally converting the analog signals generated from the first to fourth sensors 211 to 214 may not be added. However, the inventive concept is not limited thereto, and the first to fourth pre-processing circuits 221 to 224 may be implemented to digital-convert the first to fourth sensing signals S1 to S4 and process the digital signal.

FIG. 2 shows four pre-processing circuits, but is not limited thereto. For example, the artificial intelligence system 200 may further include a pre-processing circuit for pre-processing between the first sensing signal S1 and the fourth sensing signal S4, and a pre-processing circuit for pre-processing between the second sensing signal S2 and the third sensing signal S3. As the conditions for adjacent sensors are widened, the accuracy of data analysis will increase, but the number of circuits increases and the number of differential signals will increase. Therefore, depending on the selection criteria of the valid data and the application field of the artificial intelligence system 200, the number of pre-processing circuits may be increased or decreased.

Figure 3:
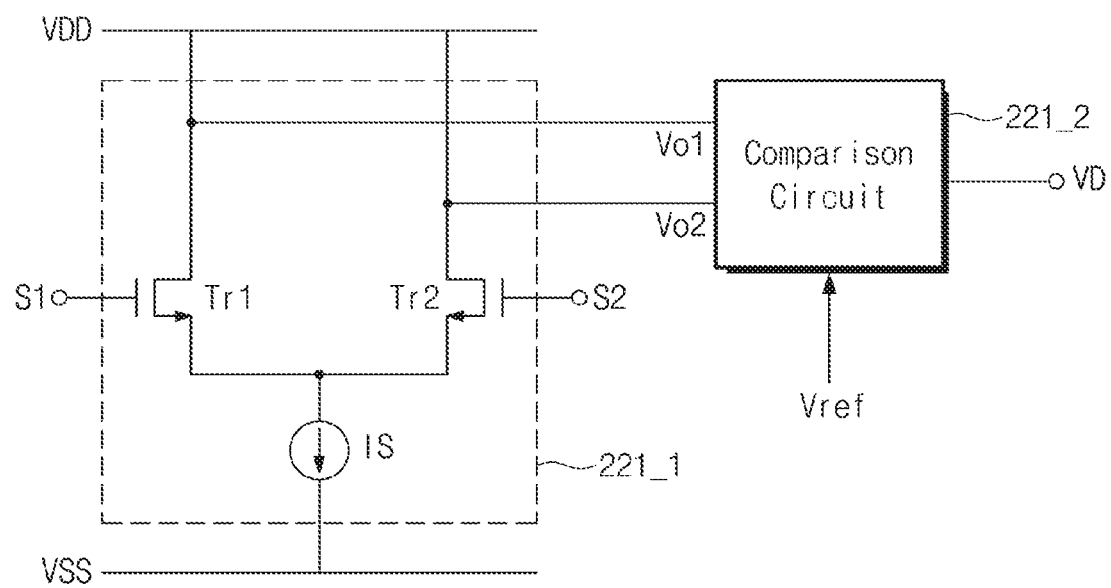
FIG. 3 is a diagram specifically showing an embodiment of the pre-processing circuit of FIG. 2.

FIG. 3 is a view showing an embodiment of the pre-processing circuit of FIG. 2 in detail. FIG. 3 exemplarily shows the first pre-processing circuit 221 of FIG. 2, and the configuration of the second to fourth pre-processing circuits 222 to 224 of FIG. 2 may be the same as that of FIG. 3. Referring to FIG. 3, the first pre-processing circuit 221 includes a differential amplification circuit 221_1 and a comparison circuit 221_2. The first pre-processing circuit 221 of FIG. 3 will be understood as merely an embodiment, and the structure of the first to fourth pre-processing circuits 221 to 224 of FIG. 2 is not limited to FIG. 3.

The differential amplification circuit 221_1 outputs a differential signal based on the difference between the first sensing signal S1 and the second sensing signal S2. For this, the differential amplification circuit 221_1 may include first and second transistors Tr1 and Tr2, and a current source IS. The first and second transistors Tr1 and Tr2 may be NMOS, but are not limited thereto. One terminal of the first transistor Tr1 receives the voltage VDD, the other terminal is connected to the current source IS, and the control terminal may receive the first sensing signal S1. One terminal of the second transistor Tr2 receives the voltage VDD and the other terminal thereof is connected to the current source IS and the other terminal of the first transistor Tr1, and the control terminal may receive the second sensing signal S2.

The differential amplification circuit 221_1 may be configured to amplify and output the difference between the first sensing signal S1 and the second sensing signal S2. The current flowing through the first transistor Tr1 may be determined according to the magnitude of the first sensing signal S1 and the current flowing through the second transistor Tr2 may be determined according to the magnitude of the second sensing signal S2. Due to the fixed tail current flowing through the current source IS, the sum of the current flowing through the first transistor Tr1 and the current flowing through the second transistor Tr2 may be constant. Therefore, depending on the difference between the first sensing signal S1 and the second sensing signal S2, the ratio between the current flowing in the first transistor Tr1 and the current flowing in the second transistor Tr2 is determined. Accordingly, the first output voltage Vo1 and the second output voltage Vo2 may be determined.

The differential amplification circuit 221_1 may output the first output voltage Vo1 and the second output voltage Vo2 to the comparison circuit 221_2 as a differential signal. However, the inventive concept is not limited to this, and the differential amplification circuit 221_1 may output the first output current and the second output current to the comparison circuit 221_2 as a differential signal. Alternatively, the differential amplification circuit 221_1 may output the single output voltage (or output current) as a differential signal.

The comparison circuit 221_2 may compare the differential signal received from the differential amplification circuit 221_1 with the reference signal Vref. For example, when the voltage level of the differential signal is greater than (or more than) the voltage level of the reference signal Vref, the comparison circuit 221_2 may select the voltage level of the differential signal as valid data VD and output it to the artificial intelligence module. When the voltage level of the differential signal is lower than or equal to (or smaller than) the voltage level of the reference signal Vref, the comparison circuit 221_2 may determine the voltage level of the differential signal as invalid data and may not output it to the artificial intelligence module. As a result, the amount of data inputted to the artificial intelligence module may be reduced.

Figure 4:
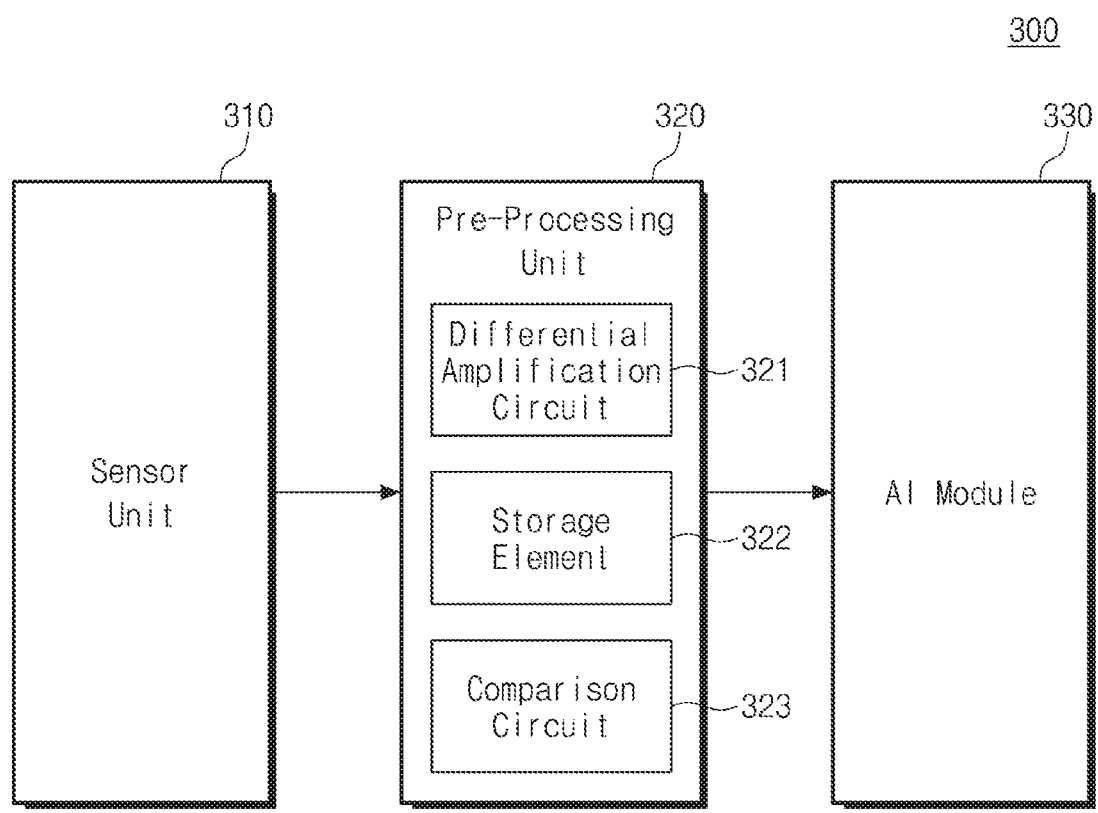
FIG. 4 is a block diagram specifically illustrating an embodiment of the artificial intelligence system of FIG. 1.

FIG. 4 is a block diagram specifically illustrating an embodiment of the artificial intelligence system of FIG. 1. FIG. 4 is a diagram for explaining a process of preprocessing temporally adjacent sensing signals. Referring to FIG. 4, the artificial intelligence system 300 includes a sensor unit 310, a pre-processing unit 320, and an artificial intelligence module 330. The sensor unit 310, the pre-processing unit 320, and the artificial intelligence module 330 correspond to the sensor unit 110, the pre-processing unit 120, and the artificial intelligence module 130 of FIG. 1, respectively.

The sensor unit 310 generates a plurality of sensing signals over time. For example, the sensor unit 310 generates a first sensing signal for a first time and a second sensing signal for a second time after the first time. The sensor unit 310 may include a plurality of sensors disposed in different spaces. Each of the plurality of sensors may generate a plurality of sensing signals over time.

The pre-processing unit 320 may sequentially receive a plurality of sensing signals over time, and may perform a preprocessing based on a difference between two temporally adjacent sensing signals. The pre-processing unit 320 may include a differential amplification circuit 321, a storage element 322, and a comparison circuit 323. A differential amplification circuit 321 amplifies the difference between the two temporally adjacent sensing signals. For example, the differential amplification circuit 321 may amplify the difference between the first sensing signal generated during the first time and the second sensing signal generated during the second time to generate a differential signal.

The storage element 322 may store a first sensing signal to amplify the difference between the first sensing signal and the second sensing signal. To simultaneously input the first and second sensing signals to the differential amplification circuit 321, the storage element 322 may first store the first sensing signal inputted to the pre-processing unit 320. Thereafter, when the second sensing signal is inputted to the pre-processing unit 320, the storage element 322 may output the first sensing signal to the differential amplification circuit 321. For example, the storage element 322 may be configured as a buffer circuit, but is not limited thereto, and may be implemented with various circuits capable of temporarily storing a sensing signal. Illustratively, the storage element 322 may output the input signal in a first-in first-out manner.

The comparison circuit 323 compares the differential signal generated by the differential amplification circuit 321 with the reference signal and may select valid data based on the comparison result. For example, when the voltage level of the differential signal is greater than (or more than) the voltage level of the reference signal, the comparison circuit 323 may select the voltage level of the differential signal as valid data and output it to the artificial intelligence module. When the voltage level of the differential signal is lower than or equal to (or smaller than) the voltage level of the reference signal, the comparison circuit 323 may determine the voltage level of the differential signal as invalid data and may not output it to the artificial intelligence module. As a result, the amount of data inputted to the artificial intelligence module may be reduced.

The artificial intelligence module 330 may analyze the valid data and calculate the result data according to the analyzed result. The artificial intelligence module 330 may analyze the time-series variation of the periphery of the sensor unit 310 to determine the state of the periphery. As a differential signal of a relative magnitude over time is adopted as data to be inputted to the artificial intelligence module 330, the environmental variation of a specific area over time may be easily analyzed.

Figure 5:
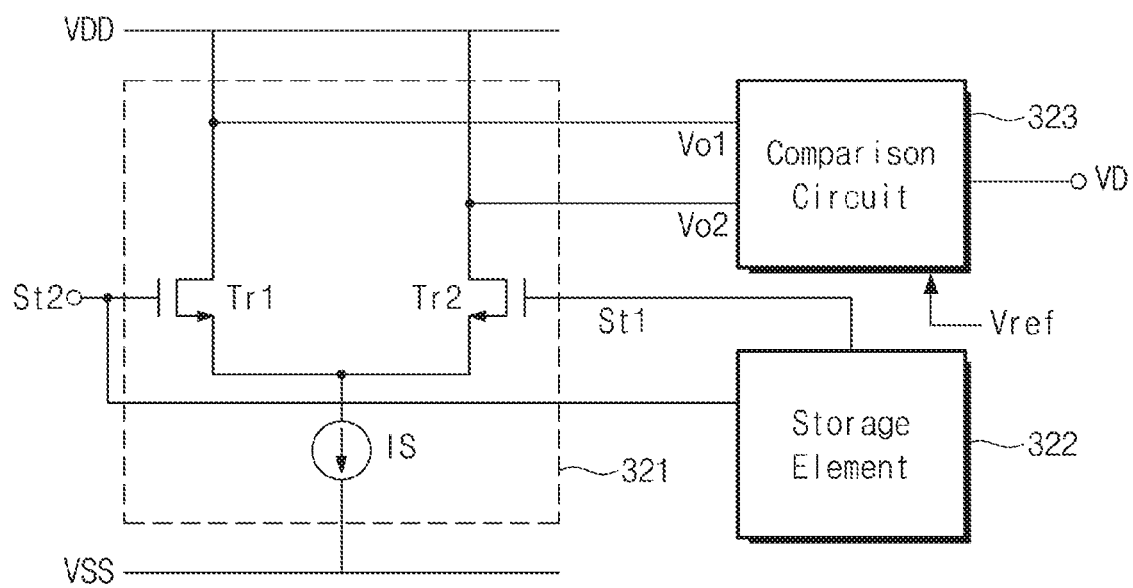
FIG. 5 is a diagram specifically showing an embodiment of the pre-processing circuit of FIG. 4.

FIG. 5 is a view showing an embodiment of the pre-processing circuit of FIG. 4 in detail. The pre-processing unit (or pre-processing circuit) 320 may include a differential amplification circuit 321, a storage element 322, and a comparison circuit 323. The pre-processing unit 320 of FIG. 5 will be understood as merely an embodiment, and the structure of the pre-processing unit 320 of FIG. 4 is not limited to FIG. 5.

The differential amplification circuit 321 outputs a differential signal based on the difference between the first sensing signal St1 and the second sensing signal St2. It is assumed that the second sensing signal St2 is generated in the sensor unit 310 after the first sensing signal St1 is generated in the sensor unit 310 of FIG. 4. The differential amplification circuit 321 may include the first and second transistors Tr1 and Tr2 and the current source IS and may have substantially the same structure as the differential amplification circuit 221_1 of FIG. 3. The differential amplification circuit 321 may output the first output voltage Vo1 and the second output voltage Vo2 to the comparison circuit 323 as a differential signal, and is not limited thereto, and may output the first and second output currents, or output the single-phase output voltage or output current as a differential signal.

The storage element 322 temporarily stores the received sensing signal temporally and outputs the stored sensing signal to the differential amplification circuit 321 when receiving the next sensing signal. For example, when the first sensing signal St1 is inputted to the control terminal of the first transistor Tr1, the first sensing signal St1 may be stored in the storage element 322. Thereafter, when the second sensing signal St2 is inputted to the control terminal of the first transistor Tr1, the first sensing signal St1 stored in the storage element 322 is inputted to the control terminal of the second transistor Tr2. At this time, the first sensing signal St1 and the second sensing signal St2 may be differentially amplified and outputted to the comparison circuit 323. At the same time, the second sensing signal St2 may be stored in the storage element 322. By repeating this operation, a differential signal for two sensing signals that are temporally adjacent to each other may be generated.

The comparison circuit 323 may compare the differential signal received from the differential amplification circuit 321 with the reference signal Vref. The comparison circuit 323 may select valid data VD based on the comparison result. The comparison circuit 323 may output the valid data VD to the artificial intelligence module 330 of FIG. 4. The comparison circuit 323 may have substantially the same structure as the comparison circuit 221_2 of FIG. 3.

Figure 6:
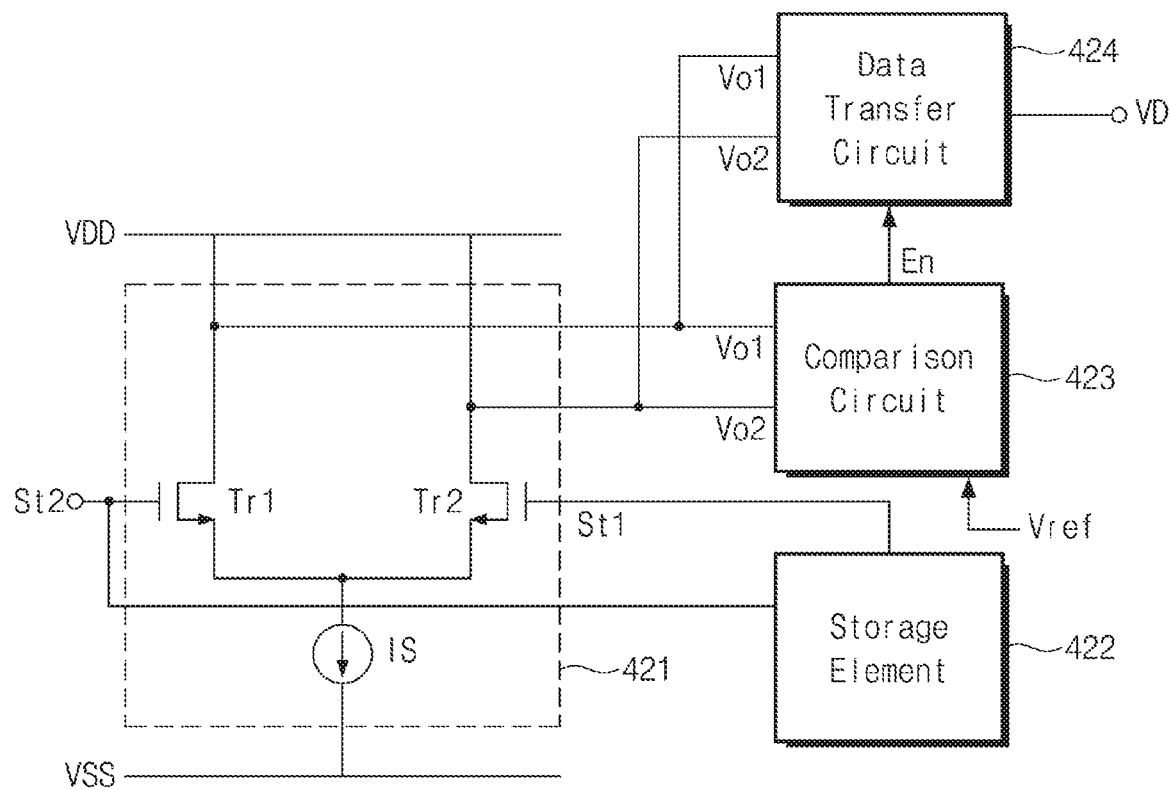
FIG. 6 is a diagram specifically showing an embodiment of the pre-processing circuit of FIG. 4.

FIG. 6 is a view showing an embodiment of the pre-processing circuit of FIG. 4 in detail. Referring to FIG. 6, a pre-processing unit (or pre-processing circuit) 420 includes a differential amplification circuit 421, a storage element 422, a comparison circuit 423, and a data transfer circuit 424. The pre-processing unit 420 of FIG. 6 will be understood as merely an embodiment, and the structure of the pre-processing unit 420 of FIG. 4 is not limited to FIG. 6. As compared with the pre-processing unit 320 of FIG. 5, the pre-processing unit 420 of FIG. 6 may be divided into a comparison circuit 423 for generating an enable signal En to select valid data VD and a data transfer circuit 424 for transferring data to an artificial intelligence module of valid data VD. The differential amplification circuit 421 and the storage element 422 of FIG. 6 are substantially the same as the differential amplification circuit 321 and the storage element 322 of FIG. 5, so a detailed description thereof is omitted.

The comparison circuit 423 may compare the differential signal received from the differential amplification circuit 421 with the reference signal Vref. The comparison circuit 423 may generate the enable signal En based on the comparison result of the differential signal and the reference signal Vref. For example, the comparison circuit 423 may receive the first output voltage Vo1 and the second output voltage Vo2 from the differential amplification circuit 421 as differential signals. For example, when the voltage level of the differential signal is greater than (or more than) the voltage level of the reference signal Vref, the comparison circuit 423 may generate an enable signal En for activating the data transfer circuit 424. When the voltage level of the differential signal is less than or equal to (or smaller than) the voltage level of the reference signal Vref, the comparison circuit 423 may not generate the enable signal En or may generate a disable signal to prevent the activation of the data transfer circuit 424.

The data transfer circuit 424 may output valid data VD based on the enable signal En. The data transfer circuit 424 may receive the first output voltage Vo1 and the second output voltage Vo2 from the differential amplification circuit 421 as differential signals. When the data transfer circuit 424 receives the enable signal En from the comparison circuit 423, the data transfer circuit 424 may output the received differential signal as valid data VD. When the data transfer circuit 424 does not receive the enable signal En or receives the disable signal, the data transfer circuit 424 does not output the valid data VD. For example, the data transfer circuit 424 may include a switch for determining the transfer of the differential signal by the enable signal En.

The comparison circuit 423 and the data transfer circuit 424 included in the pre-processing unit 420 may be applied to the first to fourth pre-processing circuits 221 to 224 of FIG. 2. For example, in FIG. 3, which specifically illustrates the pre-processing circuit of FIG. 2, the comparison circuit 221_2 may generate an enable signal according to a comparison result between the differential signal and the reference signal Vref. In this case, the pre-processing circuit 221 may further include a data transfer circuit for outputting the differential signal as valid data VD based on the enable signal. That is, the comparison circuit 423 and the data transfer circuit 424 of FIG. 6 may also be used in the case of pre-processing sensing signals outputted from spatially adjacent sensors.

Figure 7:
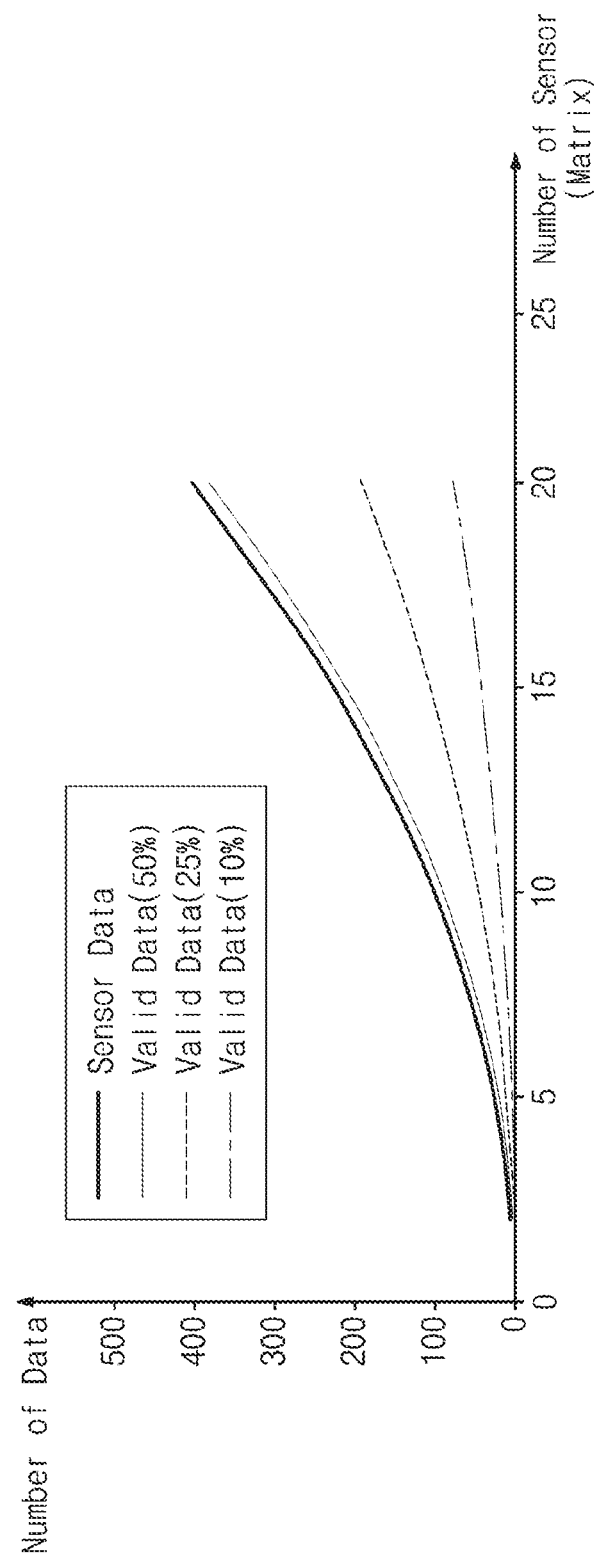
FIG. 7 is a graph illustrating the effect of reducing the amount of data inputted to the artificial intelligence module in the artificial intelligence system of FIG. 1.

FIG. 7 is a graph illustrating the effect of reducing the amount of data inputted to the artificial intelligence module in the artificial intelligence system of FIG. 1. Referring to FIG. 7, the horizontal axis is defined as the number of sensors, and the vertical axis is defined as the number of data. Here, it is assumed that the sensors are arranged in a two-dimensional matrix form. And, the horizontal axis represents the number of sensors corresponding to a row or column in the sensors arranged in a two-dimensional matrix. For example, if the value of the horizontal axis is 20, the number of sensors will be understood as 20×20. For convenience of explanation, referring to the reference numerals of FIG. 1, FIG. 7 will be described.

The bold solid lines indicate the number of sensor data inputted to the artificial intelligence module 130 when there is no preprocessing process by the pre-processing unit 120. If there is no preprocessing process, the number of sensor data inputted to the artificial intelligence module 130 corresponds to the number of sensors. For example, when the value of the horizontal axis is 20, the number of sensor data is 400.

The solid line indicates the number of data inputted to the artificial intelligence module 130 when the preprocessing unit 120 performs a preprocessing process and the valid data is 50%. When the sensors are arranged in the form of a two-dimensional matrix defined by row direction and column direction, it is assumed that the pre-processing unit 120 performs differential amplification of the sensing signals generated from two sensors adjacent in the row direction or the column direction. In this case, the number of differential signals generated based on 2×2 or more sensors is larger than the number of sensors. For example, when the value of the horizontal axis is 20, the number of sensor signals is 760, which is more than 400. When the valid data is 50%, the number of data inputted to the artificial intelligence module 130 is 380. That is, as compared to when absolute sensing signals are inputted without a preprocessing process, the number of data inputted to the artificial intelligence module 130 may be reduced.

The dotted line indicates the number of data inputted to the artificial intelligence module 130 when the valid data is 25%. The dash-dotted line indicates the number of data inputted to the artificial intelligence module 130 when the valid data is 10%. If the value of the horizontal axis is 20 and the valid data is 25%, the number of data inputted to the artificial intelligence module 130 is 190. If the value of the horizontal axis is 20 and the valid data is 10%, the number of data inputted to the artificial intelligence module 130 is 76. In other words, in a stable state of less valid data, the number of data inputted to the artificial intelligence module 130 may be reduced, and the amount of computation of the artificial intelligence module 130 may be reduced.

When the artificial intelligence system 100 is used in the Internet of Things system or the like, in most of the time, the situation in the periphery will remain stable. Therefore, the amount of computation of the artificial intelligence system 100 may be reduced by using the pre-processing unit 120. In addition, since the data of the area in which the periphery is rapidly changing is adopted as the valid data, the characteristics of the periphery may be effectively extracted even with a small amount of computation.

Figure 8:
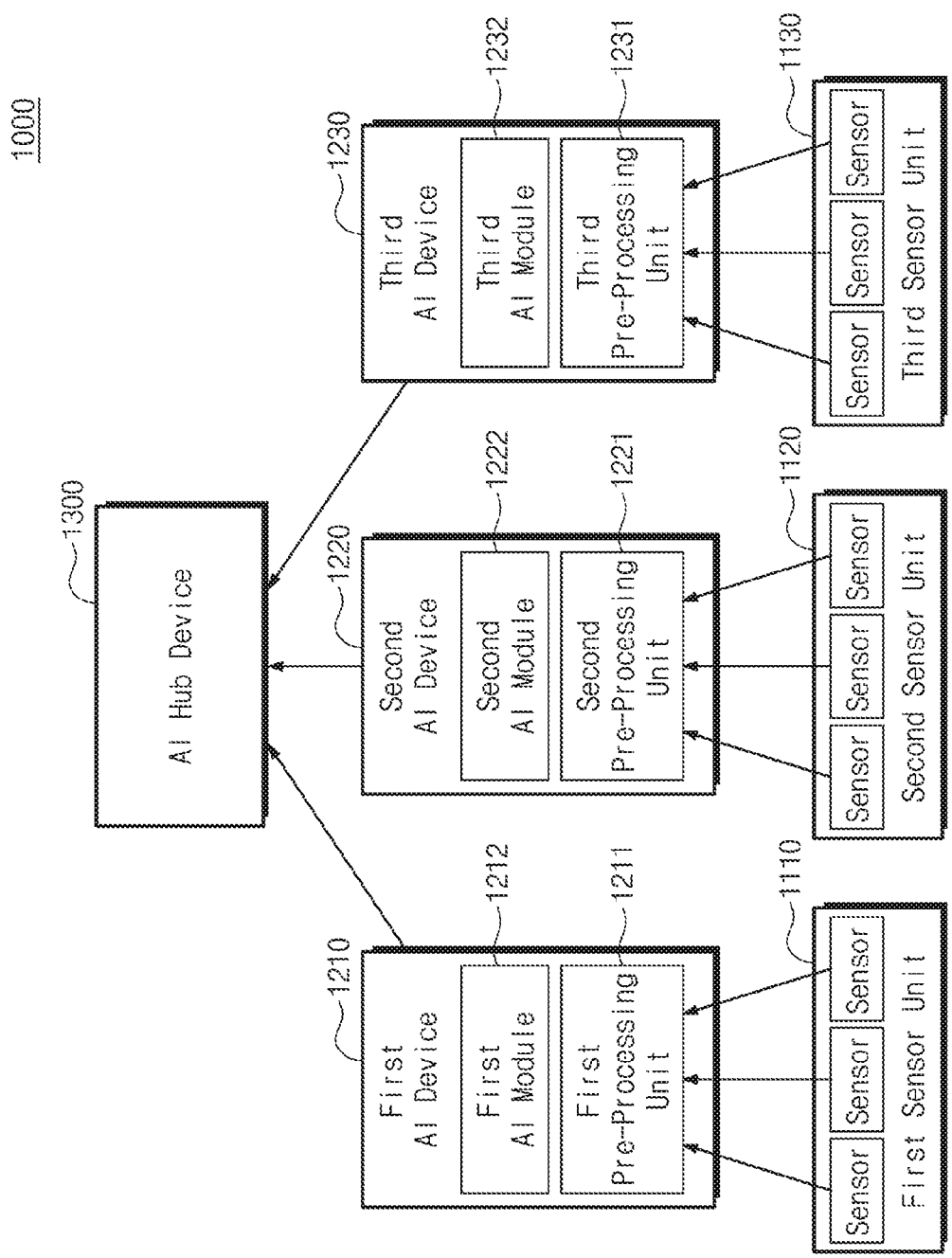
FIG. 8 is a block diagram of an artificial intelligence system according to an embodiment of the inventive concept.

FIG. 8 is a block diagram of an artificial intelligence system according to an embodiment of the inventive concept. Referring to FIG. 8, an artificial intelligence system 1000 includes first to third sensor units 1110, 1120 and 1130, first to third artificial intelligence devices 1210, 1220 and 1230, and an artificial intelligence hub device 1300. Illustratively, the number of sensor units and artificial intelligence devices is shown as three, but not limited thereto. Various numbers of sensor units and artificial intelligence devices may be provided in the artificial intelligence system 1000.

The first sensor unit 1110 and the first artificial intelligence device 1210 may constitute one artificial intelligence system. Similarly, the second sensor unit 1120 and the second artificial intelligence device 1220 may constitute one artificial intelligence system, and the third sensor unit 1130 and the third intelligent device 1230 may constitute one artificial intelligence system. Artificial intelligence systems configured in parallel with each other may construct learning models through different data learning. Thus, different artificial intelligence systems may determine the situation differently for the same sensing signals.

Each of the first to third sensor units 1110, 1120, and 1130 may include a plurality of sensors. The plurality of sensors included in each of the first to third sensor units 1110, 1120, and 1130 may be spaced apart from each other by a predetermined distance. Each of the first to third sensor units 1110, 1120 and 1130 corresponds to the sensor unit 110 of FIG. 1.

The first artificial intelligence device 1210 may include a first pre-processing unit 1211 and a first artificial intelligence module 1212. The second artificial intelligence device 1220 may include a second pre-processing unit 1221 and a second artificial intelligence module 1222. The third artificial intelligence device 1230 may include a third pre-processing unit 1231 and a third artificial intelligence module 1232. The first to third pre-processing units 1211, 1221, and 1231 correspond to the pre-processing unit 120 of FIG. 1, and the first to third artificial intelligence modules 1212, 1222, and 1232 correspond to the artificial intelligence module 130 of FIG. 1. That is, each of the first to third pre-processing units 1211, 1221 and 1231 differentially amplifies the sensing signals corresponding to the adjacent sensors among the received plurality of sensing signals, and selects valid data. Then, each of the first to third artificial intelligence modules 1212, 1222, and 1232 may analyze the selected valid data to generate the result data.

The artificial intelligence hub device 1300 receives result data or valid data from each of the first to third artificial intelligence devices 1210, 1220, and 1230. The artificial intelligence hub device 1300 may re-analyze the result data or valid data received from the three artificial intelligence devices to generate the final result data. That is, the first to third artificial intelligence modules 1212, 1222, and 1232 analyze valid data based on a simplified learning model than the artificial intelligence hub device 1300, and the artificial intelligence hub device 1300 may analyze a large amount of data integrally. Illustratively, since the first to third artificial intelligence modules 1212, 1222, and 1232 output fast result data based on valid data, it is possible to cope with the urgent situation of the periphery of the first to third sensor units 1110, 1120, and 1130. Since the artificial intelligence hub device 1300 analyzes a large amount of data, the state of the periphery of the first to third sensor units 1110, 1120, and 1130 may be accurately determined.

The artificial intelligence hub device 1300 may reset the reference signals of the first to third artificial intelligence modules 1212, 1222, and 1232, respectively. As a result of learning result data or valid data, the artificial intelligence hub device 1300 may recognize an artificial intelligence module that generates the most accurate result data among the first to third artificial intelligence modules 1212, 1222, and 1232. The artificial intelligence hub device 1300 may control the first to third artificial intelligence modules 1212, 1222 and 1232 to apply the reference signal used in the artificial intelligence module that generated the most accurate result data to other artificial intelligence modules. Thus, the artificial intelligence system 1000 may improve the accuracy of the analysis of all artificial intelligence modules.

As an artificial intelligence system according to an embodiment of the inventive concept includes a pre-processing unit for selecting valid data based on sensing signals provided from a sensor, it may minimize the amount of data inputted to the artificial intelligence module and effectively extract characteristics of the sensor periphery.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. An artificial intelligence system comprising:
    a first sensor configured to generate a first sensing signal during a sensing time;
    a second sensor disposed adjacent to the first sensor and configured to generate a second sensing signal during the sensing time;
    a pre-processing unit configured to select valid data according to a magnitude of a differential signal generated based on a difference between the first sensing signal and the second sensing signal; and
    an artificial intelligence module configured to analyze the valid data to generate result data;
    wherein the pre-processing unit comprises:
    a differential amplification circuit configured to generate the differential signal based on the difference between the first sensing signal and the second sensing signal; and
    a comparison circuit configured to select the valid data based on a comparison result of the differential signal and a reference signal.

2. The artificial intelligence system of claim 1, wherein the comparison circuit selects the differential signal as the valid data and outputs the differential signal to the artificial intelligence module when the magnitude of the differential signal is larger than a magnitude of the reference signal.

3. The artificial intelligence system of claim 1, wherein when the magnitude of the differential signal is less than or equal to a magnitude of the reference signal, the comparison circuit selects the differential signal as invalid data and removes the differential signal.

4. The artificial intelligence system of claim 1, wherein the pre-processing unit further comprises:
    a data transfer circuit configured to output the differential signal as the valid data when the enable signal is received.

5. The artificial intelligence system of claim 1, further comprising a third sensor disposed adjacent to the first sensor and configured to generate a third sensing signal during the sensing time,
    wherein the first sensor and the second sensor are disposed adjacent to each other in a first direction, and the first sensor and the third sensor are disposed adjacent to each other in a second direction intersecting the first direction, and
    wherein the pre-processing unit further selects the valid data according to a magnitude of a differential signal generated based on a difference between the first sensing signal and the third sensing signal.

6. The artificial intelligence system of claim 5, wherein the pre-processing unit further comprises:
    a first pre-processing circuit configured to generate a first differential signal based on the difference between the first sensing signal and the second sensing signal and outputs the first differential signal to the artificial intelligence module when a magnitude of the first differential signal is larger than a magnitude of the reference signal; and
    a second pre-processing circuit configured to generate a second differential signal based on the difference between the first sensing signal and the third sensing signal and outputs the second differential signal to the artificial intelligence module when a magnitude of the second differential signal is larger than the magnitude of the reference signal.

7. The artificial intelligence system of claim 5, further comprising a fourth sensor disposed adjacent to the second sensor in the second direction and disposed adjacent to the third sensor in the first direction and configured to generate a fourth sensing signal during the sensing time,
    wherein the pre-processing unit is configured to further select the valid data according to a magnitude of a differential signal generated based on a difference between the second sensing signal and the fourth sensing signal and a magnitude of a differential signal generated based on a difference between the third sensing signal and the fourth sensing signal.

8. The artificial intelligence system of claim 1, further comprising an artificial intelligence hub device for determining a state of a periphery of the first sensor and the second sensor based on the result data.

9. The artificial intelligence system of claim 8,
    wherein the artificial intelligence hub device learns the result data or the valid data and resets the reference signal.

10. The artificial intelligence system of claim 1, wherein the artificial intelligence module determines a state of a periphery of the first sensor and the second sensor when receiving the valid data.

11. An artificial intelligence system comprising:
a sensor configured to generate a first sensing signal during a first sensing time and a second sensing signal during a second sensing time after the first sensing time;
a pre-processing unit configured to select valid data according to a magnitude of a differential signal generated based on a difference between the first sensing signal and the second sensing signal; and
an artificial intelligence module configured to analyze the valid data and generate result data;
wherein the pre-processing unit comprises:
a differential amplification circuit configured to generate the differential signal based on the difference between the first sensing signal and the second sensing signal; and
a comparison circuit configured to select the differential signal as the valid data and output the differential signal to the artificial intelligence module when the differential signal is larger than a reference signal.

12. The artificial intelligence system of claim 11, wherein the pre-processing unit further comprises a storage element for storing the first sensing signal during the first sensing time and outputting the first sensing signal to the differential amplification circuit when the second sensing signal is inputted to the differential amplification circuit.

13. The artificial intelligence system of claim 11, wherein the pre-processing unit further comprises:
a data transfer circuit configured to output the differential signal as the valid data to the artificial intelligence module based on the enable signal.

14. The artificial intelligence system of claim 11, further comprising an adjacent sensor disposed adjacent to the sensor and configured to generate a third sensing signal during the first sensing time and generate a fourth sensing signal during the second sensing time,
wherein the pre-processing unit is configured to further select valid data according to a magnitude of a differential signal generated based on a difference between the first sensing signal and the third sensing signal and a magnitude of a differential signal generated based on a difference between the second sensing signal and the fourth sensing signal.

* * * * *